United States Patent
Ishida et al.

(10) Patent No.: US 9,610,778 B2
(45) Date of Patent: Apr. 4, 2017

(54) LIQUID DISCHARGE HEAD AND METHOD FOR PRODUCING LIQUID DISCHARGE HEAD

(71) Applicant: CANON KABUSHIKI KAISHA, Tokyo (JP)

(72) Inventors: Yuzuru Ishida, Yokohama (JP); Yoshinori Misumi, Tokyo (JP); Maki Kato, Fuchu (JP); Norihiro Yoshinari, Kawasaki (JP); Akio Goto, Tokyo (JP); Takahiro Matsui, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/170,747

(22) Filed: Jun. 1, 2016

(65) Prior Publication Data

US 2016/0355013 A1 Dec. 8, 2016

(30) Foreign Application Priority Data

Jun. 5, 2015 (JP) .................. 2015-115200

(51) Int. Cl.
*B41J 2/14* (2006.01)
*B41J 2/335* (2006.01)
*B41J 2/16* (2006.01)
*C23F 1/00* (2006.01)

(52) U.S. Cl.
CPC .......... *B41J 2/335* (2013.01); *B41J 2/14129* (2013.01); *B41J 2/1433* (2013.01); *B41J 2/162* (2013.01); *B41J 2/1626* (2013.01); *C23F 1/00* (2013.01)

(58) Field of Classification Search
CPC ...... B41J 2/335; B41J 2/14129; B41J 2/1433; B41J 2/162; B41J 2/1626; C23F 1/00
See application file for complete search history.

(56) References Cited

U.S. PATENT DOCUMENTS

| 2009/0315956 A1* | 12/2009 | Ishida | B41J 2/14129 347/63 |
| 2010/0220154 A1* | 9/2010 | Shibata | B41J 2/14129 347/65 |

FOREIGN PATENT DOCUMENTS

JP 2011168046 A 9/2011

* cited by examiner

*Primary Examiner* — Manish S Shah
*Assistant Examiner* — Yaovi M Ameh
(74) *Attorney, Agent, or Firm* — Canon U.S.A., Inc. IP Division (57) ABSTRACT

A liquid discharge head has a chamber wall member forming a liquid chamber and a discharge head substrate containing a laminate of a base substrate having a surface for an element generating energy for discharging liquid. A first and second layer is formed contacting the wall. The second layer has adhesiveness with the chamber wall member higher than adhesiveness of the first layer, forming the liquid chamber with the chamber wall member. The first layer has a portion exposed from the second layer as viewed from a first direction orthogonal to the surface and contacting the chamber wail member at a position distant from the liquid chamber in a second direction orthogonal to the inner surface of the wall relative to a portion where the wall and second layer contact, and the length in the second direction of the portion of the first layer is 0.3 µm or more.

10 Claims, 6 Drawing Sheets

LIQUID DISCHARGE HEAD AND METHOD FOR PRODUCING LIQUID DISCHARGE HEAD

BACKGROUND OF THE INVENTION

Field of the Invention

The, present invention relates to a liquid discharge head which discharges liquid and a method for producing the liquid discharge head.

Description of the Related Art

As a general configuration of a liquid discharge head which discharges liquid, such as ink, a configuration is mentioned which has a discharge port forming member in which discharge ports are formed and a liquid discharge head substrate having energy generating elements which generate energy for discharging liquid. In the energy generating elements, insulation properties between liquid and each element are secured by an insulative layer having an electrical insulation property. By driving the energy generating elements, liquid is rapidly heated to generate bubbles in a contact part (heat application portion) with the liquid above the element. The liquid is discharged from the discharge ports by the pressure generated with the bubbling to be able to perform recording on a medium surface.

Japanese Patent. Laid-Open No. 2011-168046 describes a configuration in which an adhesion layer is provided on regions other than the heat application portion of a protective layer in order to increase the adhesiveness between the discharge port forming member and the liquid discharge head substrate.

SUMMARY OF THE INVENTION

The present invention is a liquid discharge head having a liquid chamber wall member having a wall forming a liquid chamber storing liquid and a liquid discharge head substrate containing a laminate of a base substrate having a surface on which an element generating energy for discharging liquid is formed, a first layer, and a second layer disposed on the first layer, contacting the wall, and having adhesiveness with the liquid chamber wall member higher than the adhesiveness of the first layer, and forming the liquid chamber with the liquid chamber wall member, in which the first layer has a portion exposed from the second layer as viewed from a first direction orthogonal to the surface and contacting the liquid chamber wall member at a position distant from the liquid chamber in a second direction orthogonal to the inner surface of the wall relative to a portion where the wall and the second layer contact, and the length in the second direction of the portion of the first layer is 0.3 μm or more.

Further features of the present invention will become apparent from the following description of exemplary embodiments with reference to the attached drawings.

DESCRIPTION OF THE EMBODIMENTS

At present, a further increase in length of a liquid discharge head has been examined. However, a swelling degree of a discharge port forming member and a deformation degree of an element substrate become high due to the increase in length of the head, and therefore there is a possibility that the adhesiveness of the discharge port forming member and the liquid discharge head substrate decreases. Therefore, even when an adhesion layer is provided between the discharge port forming member and the protective layer, there is a concern that peeling and floating are likely to occur between the discharge port forming member and the liquid discharge head substrate.

Figure 2A:
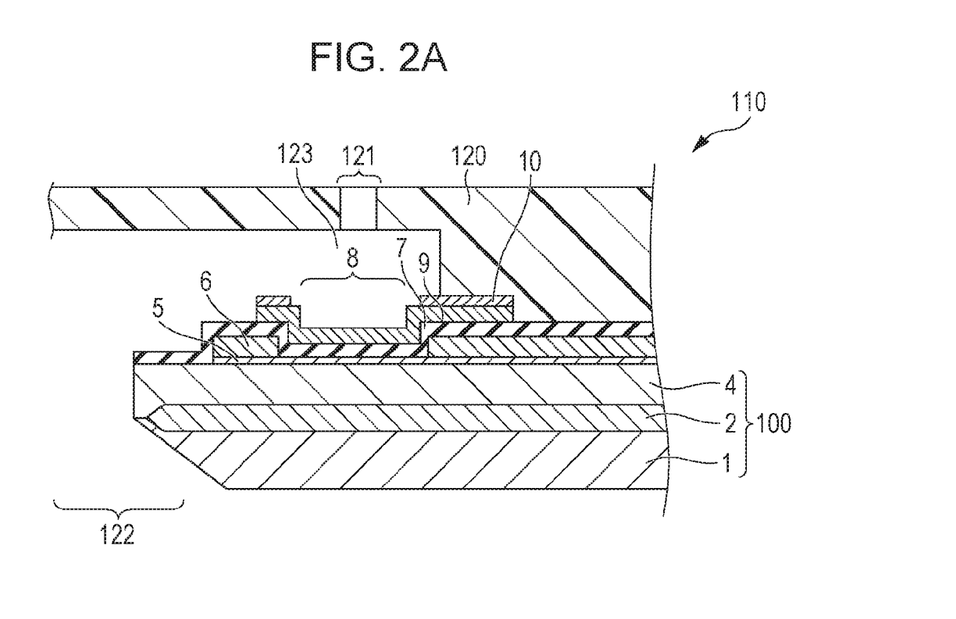
FIGS. 2A and 2B are views illustrating a liquid discharge head according to an aspect of Comparative Example.
Figure 2B:
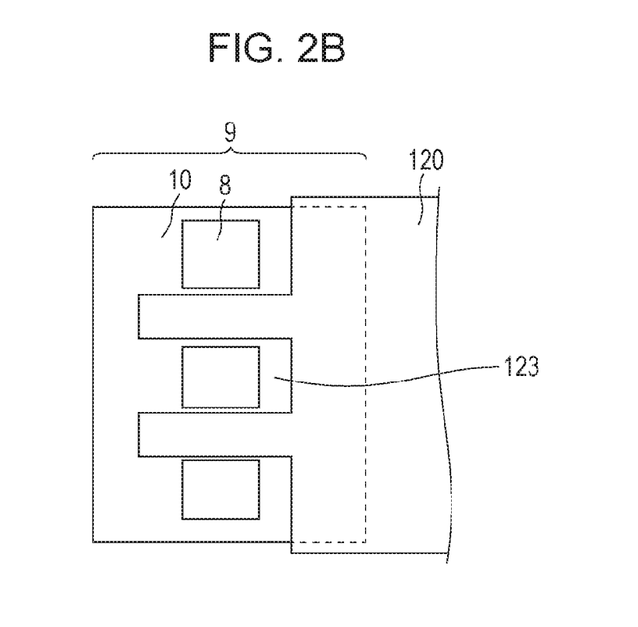

FIGS. 2A and 2b illustrate schematic views of a liquid discharge head of Comparative Example. FIG. 2A illustrates a cross-sectional schematic view of a liquid discharge head. FIG. 2B illustrates a top view of a part of the liquid discharge head, in which a discharge port forming member 120 is drawn in perspective in order to explain the position of the discharge port forming member 120 in a bonding surface with a liquid discharge head substrate 100. In particular, stress is likely to be concentrated on a region around a liquid chamber 123 corresponding to an end portion of the pattern of the discharge port forming member 120, and thus peeling and floating of the discharge port forming member 120 is likely to occur in this region. When the peeling and the floating of the discharge port forming member 120 occur around the liquid chamber 123, the discharge properties of the liquid discharge head decrease, which poses a problem that the reliability of the liquid discharge head may deteriorate.

The present invention aims at suppressing the occurrence of the peeling and the floating between the discharge port forming member (liquid chamber wall member) and the liquid discharge head substrate around the liquid chamber.

According to the present invention, the adhesiveness of a first layer with a discharge port forming member is lower than that of a second layer and the first layer is exposed from the second layer to contact a discharge port forming member, and therefore the discharge port forming member can slide in a direction horizontal to a surface contacting the liquid discharge head substrate. Thus, the stress concentrated around the liquid chamber in connection with the swelling of the discharge port forming member or the deformation of the liquid discharge head substrate is reduced, which makes it possible to suppress the occurrence of the peeling and the floating between the discharge port forming member and the liquid discharge head substrate.

Hereinafter, embodiments of the present invention are described with reference to the drawings.

First Embodiment

Figure 1:
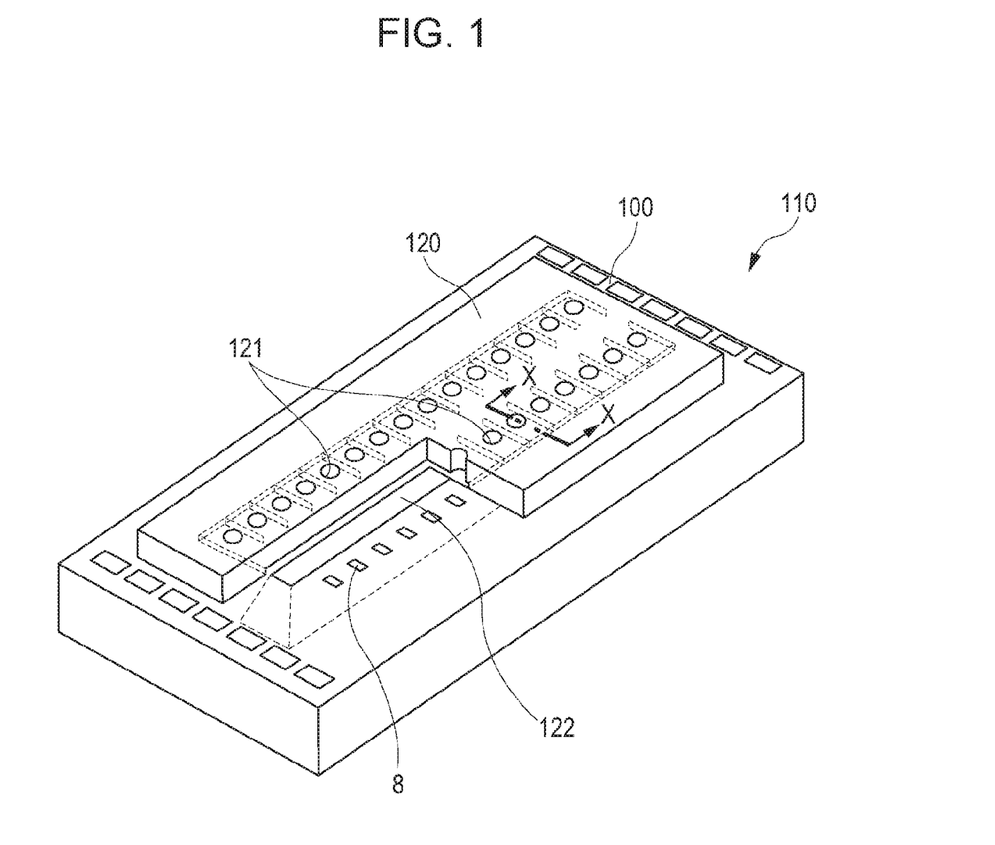
FIG. 1 is a perspective view of a liquid discharge head according to an embodiment of the present invention.

FIG. 1 is a perspective view of a liquid discharge head 110 as an ink jet head according to the embodiments of the present invention.

The liquid discharge head 110 has a configuration in which a discharge port forming member 120 (hereinafter also referred to as a liquid chamber wall member) in which a plurality of discharge ports 121 are formed and a liquid discharge head substrate 100 in which a plurality of heat application portions 8 which are contact parts with liquid, such as ink, are bonded. Liquid is supplied to the heat application portions 8 from a supply port 122 formed in the liquid discharge head substrate 100 in such a manner as to communicate with both surfaces thereof, bubbles are generated in the liquid by thermal energy on the heat application portions 8, and then the liquid is discharged from each discharge port 121 corresponding to each heat application portion 8.

Figure 3A:
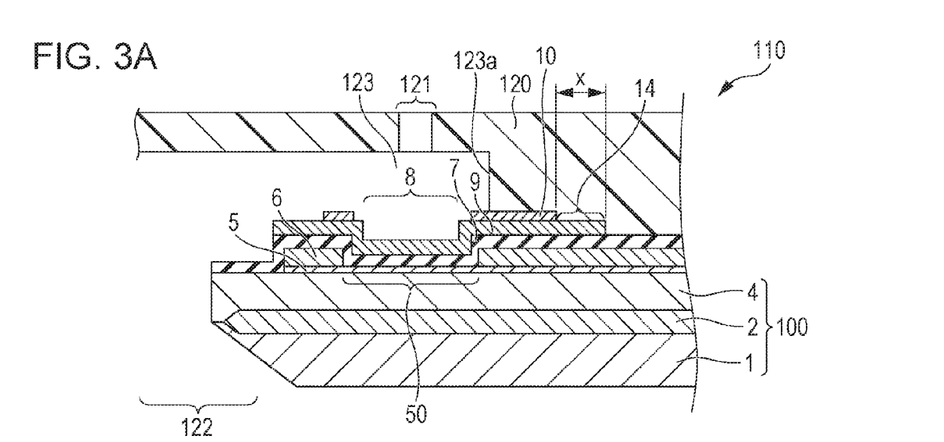
FIGS. 3A to 3C are views illustrating a liquid discharge head according to a first embodiment.
Figure 3B:
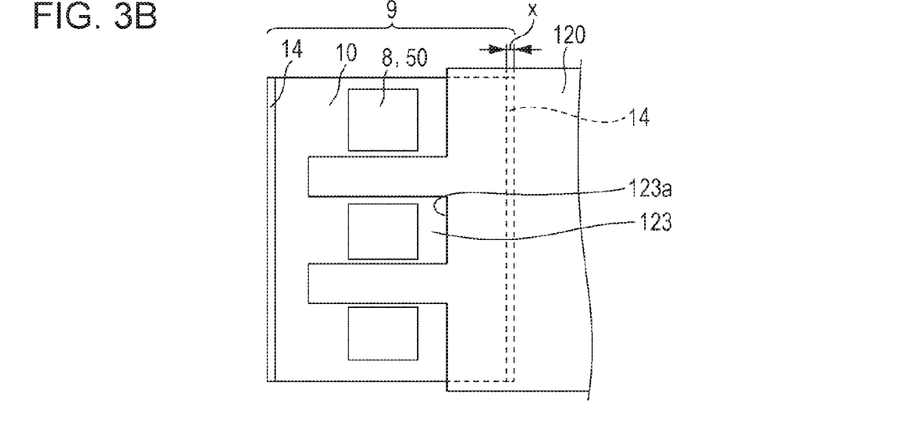
Figure 3C:
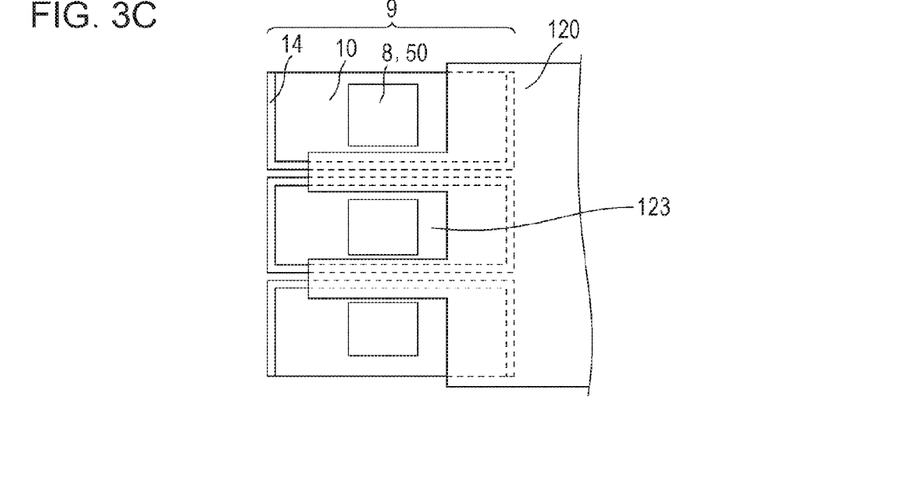

FIGS. 3A to 3C are schematic views illustrating the liquid discharge head 110 according to the first embodiment of the present invention. FIG. 3A is a cross-sectional schematic view along the X-X' line of FIG. 1. FIG. 3B and FIG. 3C are partial top views of FIG. 3A, in which the discharge port forming member 120 is drawn in perspective in order to explain the position of the discharge port forming member 120 in a bonding surface with the liquid discharge head substrate 100.

The layer configuration of the liquid discharge head substrate 100 and the liquid discharge head 110 is described with reference to FIG. 3A.

On a base substrate 1 containing silicon on which drive elements, such as a transistor, are provided, a thermal oxidation layer 2 (preferably having a thickness of 0.5 to 2 μm) provided by thermal oxidation of a part of the base substrate 1 and a thermal accumulation layer 4 (preferably having a thickness of 0.5 to 2 μm) containing a silicon compound are provided.

Furthermore, on the thermal accumulation layer a heat generating resistor layer 5 (preferably having a sheet resistance of 100 to 1000 Ω/□) containing materials which generate heat by energization (for example, TaSiN, WSiN, and the like) is provided. A pair of electrodes 6 (preferably having a thickness of 0.1 μm to 2 μm) containing materials containing aluminum and the like having electrical resistance lower than that of the heat generating resistor layer 5 as the main component are provided in such a manner as to contact the heat generating resistor layer 5. By applying a voltage between the pair of electrodes 6 to heat a portion located between the pair of electrodes 6 of the heat generating resistor layer 5, the portion of the heat generating resistor layer 5 is used as an energy generating element 50. In order to achieve insulation between the heat generating resistor layer 5 and the pair of electrodes 6 and the heat generating resistor layer 5 and the pair of electrodes 6 are covered with an insulative layer 7 (preferably having a thickness of 0.1 μm to 0.5 μm) containing insulating materials, such as silicon compounds including SiN and the like.

Furthermore, on the insulative layer 7, a protective layer 9 for protecting the energy generating element 50 from an impact caused by the cavitation caused when bubbling of liquid is provided. The protective layer 9 is configured by a single layer film containing materials, such as precious metal elements, such as Ir and Pt, and Ta, or a laminated film in which a plurality of layers containing the materials are laminated (preferably having a thickness of 0.1 μm to 0.5 μm).

Furthermore, in order to increase the adhesiveness with the discharge port forming member 120, an adhesion layer 10 (preferably having a thickness of 0.05 μm to 0.2 μm) containing SiO$_2$, SiN, SiCN, or the like is formed on the protective layer 9 in regions other than regions corresponding to the energy generating elements 50. Herein, the adhesiveness of the adhesion layer 10 with the discharge port forming member 120 formed with an organic resin material is higher than that of the protective layer 9 in this embodiment, a portion of the protective layer 9 located above the energy generating element 50 contacts liquid, and acts as the heat application portion 8.

As viewed from a direction (also referred to as a first direction) orthogonal to the surface, on which the energy generating elements 50 are formed, of the liquid discharge head substrate 100, the adhesion layer 10 is formed in such a manner that the pattern end portion of the protective layer 9 is exposed from the pattern end portion of the adhesion layer 10. Hereinafter, the portion of the protective layer 9 exposed from the adhesion layer 10 is referred to as an exposed region. 14. In this embodiment, a description is given taking the protective layer 9 as an example of the first layer which is partially exposed from the adhesion layer 10 as a second layer.

Furthermore, a discharge port forming member 120 is provided on the surface side, on which the adhesion layer 10 is formed, of the liquid discharge head substrate 100.

As illustrated in FIG. 3B, the protective layer 9 is provided in a belt shape in such a manner as to cover at least regions corresponding to the plurality of energy generating elements 50. Furthermore, the adhesion layer 10 is formed on the protective layer 9 except the regions corresponding to the energy generating elements 50 of the protective layer 9 and the pattern end portion of the protective layer 9 as described above. Therefore, as viewed from a direction perpendicular to the surface of the liquid discharge head substrate 100, the exposed region 14 of the protective layer 9 is formed along a direction where the plurality of heat application portions 8 are arranged.

In the discharge port forming member 120, a liquid chamber wall 123a is formed on a surface opposite to the surface in which discharge ports 121 are formed, and the liquid chamber wall 123a is provided in such a manner as to cover the circumference (three sides) of the heat application portion 8. The liquid chamber 123 is formed by the liquid chamber wall 123a and the surface, on which the heat application portions 8 are provided, of the liquid discharge head substrate 100.

In this embodiment, the liquid chamber wall 123a of the discharge port forming member 120 is bonded to the adhesion layer 10 of the liquid discharge head substrate 100. Furthermore, the discharge port forming member 120 is in contact with the exposed region 14 of the protective layer 9 at a position distant from the liquid chamber 123 in a direction horizontal to the bonding surface of the discharge port forming member 120 and the liquid discharge head substrate 100 relative to the bonding portion of the liquid chamber wall 123a and the adhesion layer 10. In this embodiment, the exposed region 14 is in contact with the discharge port forming member 120 at a position distant from the liquid chamber 123 in a second direction orthogonal to the inner surface forming the liquid chamber 123 of the liquid chamber wall 123a relative to the bonding portion of the liquid chamber wall 123a and the adhesion layer 10.

Herein, the protective layer 9 is formed with precious metal elements and the like having adhesiveness with the discharge port forming member 120 formed with organic resin materials lower than that of the insulative layer 7 and the adhesion layer 10. Therefore, in the bonding portion with the exposed region 14 of the protective layer 9, the discharge port forming member 120 can slide in a direction horizontal to the bonding surface with respect to the liquid discharge head substrate 100. Thus, the stress concentrated around the liquid chamber 123 in connection with the swelling of the discharge port forming member 120 or the deformation of the liquid discharge head substrate 100 is reduced, which makes it possible to suppress the occurrence of peeling and floating between the discharge port forming member 120 and the liquid discharge head substrate 100.

In this embodiment, the width x (FIG. 3A) of the exposed region 14 of the protective layer 9, i.e., the length of the exposed region 14 in the second direction orthogonal to the inner surface of the liquid chamber wail 123a, is suitably 0.3 μm or more. This is because, when the width x of the exposed region 14 is small, the stress reduction effect cannot be sufficiently obtained. Furthermore, since there is a possibility that floating occurs between the liquid discharge head substrate 100 and the discharge port forming member 120 with the exposed region 14 as the starting point when the width x of the exposed region 14 having low adhesiveness with the discharge port forming member 120 is large, the width of the exposed region 14 is suitably 2.0 μm or less.

As illustrated in FIG. 3C, a shape may be acceptable in which the protective layers 9 and the adhesion layers 10 are provided corresponding to the plurality of energy generating elements 50. In this case, as viewed from a direction orthogonal to the surface of the liquid discharge head substrate 100, the exposed region 14 of the protective layer 9 has a shape of surrounding the energy generating element 50 and the exposed region 14 also contacts the liquid chamber wall 123a located between the adjacent heat application portions 8.

The liquid discharge head substrate 100 of this embodiment is produced as follows. The protective layer 9 is formed and patterned to the base substrate 1 having the energy generating elements 50 covered with the insulative layer 7, the adhesion layer 10 is formed on the entire surface of a wafer, and then the adhesion layer 10 is patterned using a mask different from the mask used for the patterning of the protective layer 9.

Second Embodiment

Figure 4:
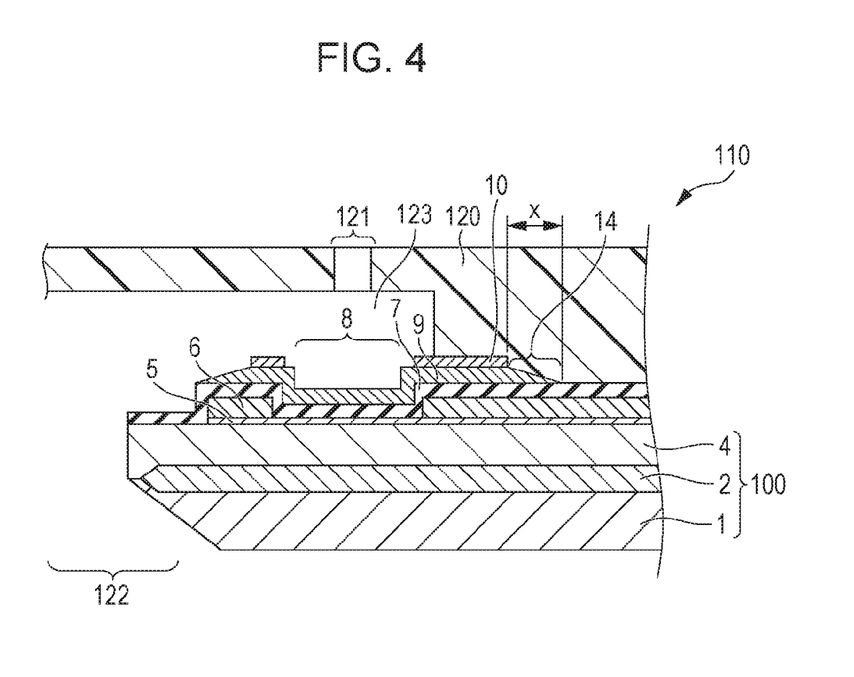
FIG. 4 is a view illustrating a liquid discharge head according to a second embodiment.

FIG. 4 illustrates a liquid discharge head 110 according to a second embodiment of the present invention and is a cross-sectional schematic view along the X-X' line of FIG. 1.

In this embodiment, the protective layer 9 and the adhesion layer 10 are patterned using the same mask unlike the above-described embodiment.

Hereinafter, a method for producing the liquid discharge head 110 of this embodiment is described with reference to FIG. 5. The materials of the liquid discharge head 110 and the numerical values of the thickness and the like thereof described below are examples, and the present invention is not limited to the following configuration.

Figure 5A:
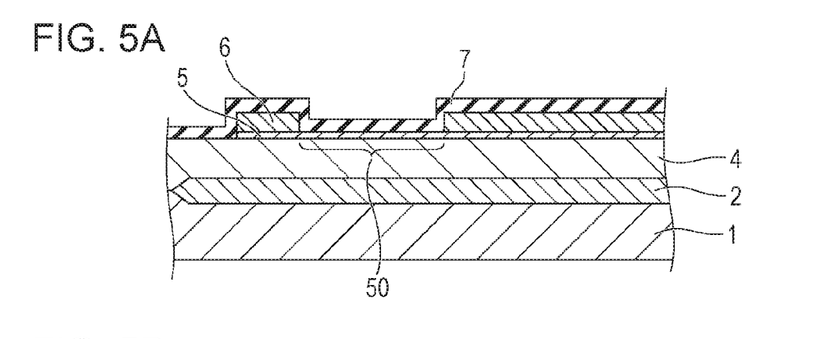
FIGS. 5A to 5D are views for explaining a method for producing the liquid discharge head according to the second embodiment.

On a base substrate 1 containing silicon on which drive elements, such as a transistor, are provided, a 1 μm thick thermal oxidation layer 2 provided by thermal oxidation of a part of the base substrate 1 is formed, and further a thermal accumulation layer 4 containing a 1 μm thick silicon oxide film is formed. On the thermal accumulation layer 4, a heat generating resistor layer 5 containing TaSiN (Sheet resistance: 300 Ω/□) and an aluminum alloy (Al—Cu, 1 μm) having resistance lower than that of the heat generating resistor layer 5 are continuously formed by a sputtering method. The heat generating resistor layers 5 and the aluminum alloy are patterned by dry etching to form an electrode 6, and then the aluminum alloy in a region which serves as an energy generating element 50 is removed by wet etching to form a pair of electrodes 6. A voltage is supplied between the pair of electrodes 6 to heat a portion located between the pair of electrodes 6 of the heat generating resistor layer 5, whereby the portion of the heat generating resistor layer 5 is used as the energy generating element 50. In this embodiment, the size of the energy generating element 50 is set to 26×26 μm.

Next, an insulative layer 7 containing SiN is formed on the entire surface of a wafer by a plasma chemical vapor deposition method to cover the heat generating resistor layer 5 and the pair of electrodes 6 (FIG. 5A).

Figure 5B:
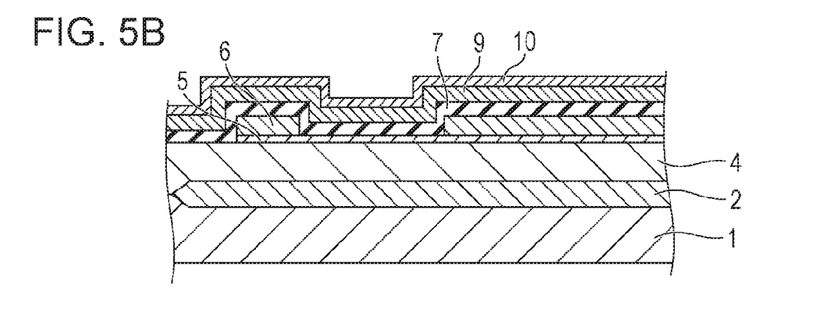

Next, as illustrated in FIG. 5B, a 0.3 μm thick Ir film is formed as the protective layer 9 on the entire surface of a wafer using a sputtering method. Furthermore, on the protective layer 9, the adhesion layer 10 with a thickness of 0.1 μm containing $SiO_2$ is formed on the entire surface of a wafer using a plasma chemical vapor deposition method.

Next, a resist mask is formed in a predetermined pattern using a photolithography method, and then patterning of the adhesion layer 10 and the protective layer 9 is performed by a dry etching method. In this embodiment, the adhesion layer 10 and the protective layer 9 are etched with one mask using an inductively coupled plasma (ICP) dry etching apparatus while dividing the etching step into two steps as follows.

Figure 5C:
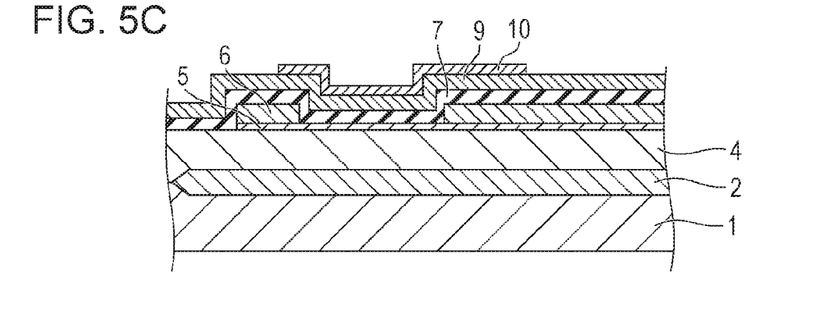

First, the adhesion layer 10 is etched under low bias conditions (Application Power: 75 W) using $Cl_2/BCl_3$ mixed gas. Under the conditions, since the protective layer 9 containing Ir is not etched, the etching is stopped on the protective layer 9 (FIG. 5C).

Figure 5D:
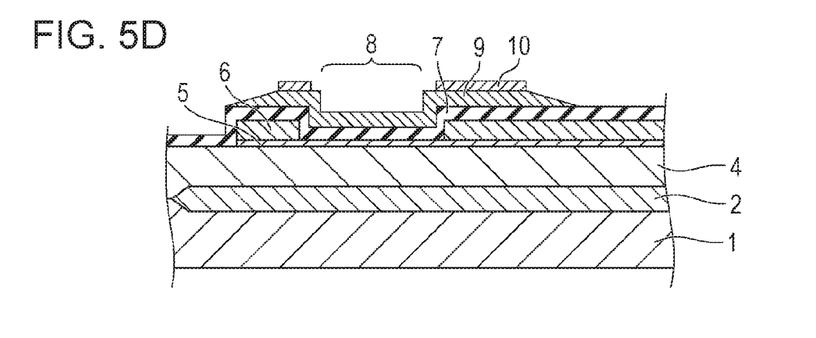

Next, the protective layer 9 containing Ir is sputter-etched under high bias conditions using $Ar/Cl_2$ mixed gas. When the Ar flow ratio is increased in the $Ar/Cl_2$ gas flow ratio in this step, the retreat of the resist mask or the adhesion layer 10 under etching can be suppressed, so that the inclination angle of the tapered shape of the pattern end portion of the protective layer 9 becomes large. On the other hand, when the $Cl_2$ flow ratio is increased, the resist mask and the adhesion layer 10 under etching are more likely to retreat, so that the inclination angle of the tapered shape of the pattern end portion of the protective layer 9 becomes small (FIG. 5D). Thus, the width dimension of the exposed region 14 can be varied by varying the $Ar/Cl_2$ flow ratio. Herein, the width of the protective layer 9 illustrated in FIG. 5D is set to 60 μm and the width x of the exposed region 14 is set to 1 μm.

Thereafter, the adhesion layer 10 is selectively removed with buffered fluoric acid to open a pad portion.

On the liquid discharge head substrate 100 thus produced, a discharge port forming member 120 is provided to complete the liquid discharge head 110. In this embodiment, the distance from the bottom surface of the liquid chamber 123 to the discharge port 121 is set to 30 μm, the height of the liquid chamber 123 is set to 15 μm, and the size of the liquid chamber 123 viewed from the top surface (FIG. 3B) is sea to 40 μm×40 μm.

Third Embodiment

Figure 6:
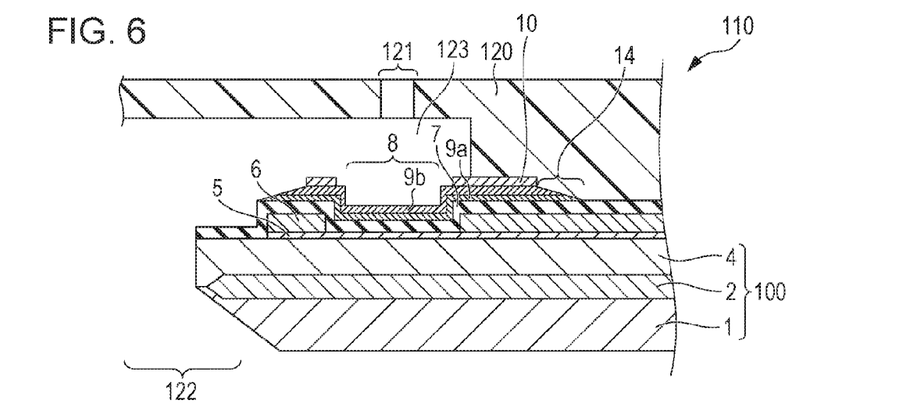
FIG. 6 is a view illustrating a liquid discharge head according to a third embodiment.

FIG. 6 illustrates a liquid discharge head 110 according to a third embodiment of the present invention and is a cross-sectional schematic view along the X-X' line of FIG. 1.

In this embodiment, a protective layer 9 in the second embodiment is formed in such a manner as to have a two-layer laminated configuration different in the adhesiveness with a discharge port forming member 120.

Specifically, a protective layer 9a containing Ir and a protective layer 9b containing Ta are formed on an insulative layer 7. More specifically, the protective layer 9b containing Ta having adhesiveness with the discharge port forming member 120 higher than that of the protective layer 9a containing Ir and lower than that of the adhesion layer 10 is provided between the protective layer 9a containing Ir and the adhesion layer 10. Thus, due to the fact that the exposed region 14 is formed by the protective layers 9a and 9b different in the adhesiveness with the discharge port forming member 120, the layers can play the role of stress reduction while securing the adhesiveness with the discharge port forming member 120, so that a more reliable liquid discharge head can be provided.

The protective layer 9b containing Ta also functions as an adhesion layer between the protective layer 9a containing Ir and the adhesion layer 10.

Fourth Embodiment

Figure 7:
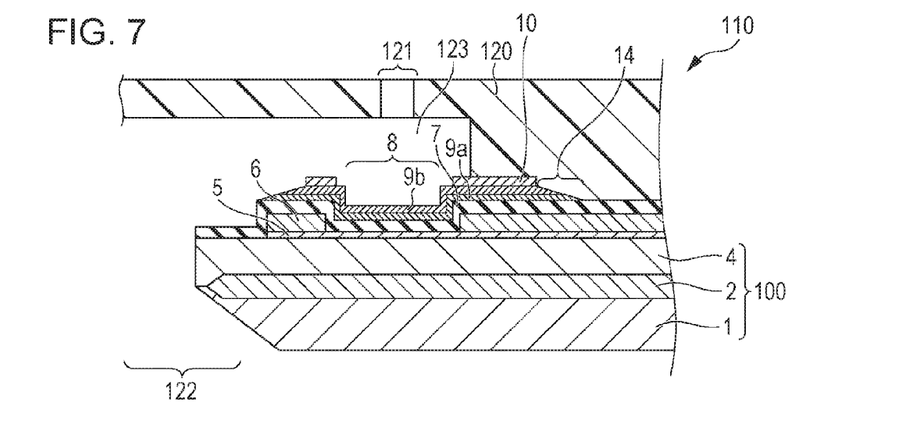
FIG. 7 is a view illustrating a liquid discharge head according to a fourth embodiment.

FIG. 7 illustrates a liquid discharge head 110 according to a fourth embodiment of the present invention and is a cross-sectional schematic view along the X-X' line of FIG. 1.

In this embodiment, a protective layer 9 is configured to have a two-layer laminated configuration in the second embodiment. Specifically, a protective layer 9a containing Ta and a protective layer 9b containing Ir are formed on an insulative layer 7. More specifically, the protective layer 9a containing Ta having adhesiveness with the discharge port forming member 120 higher than that of the protective layer 9b containing Ir and lower than that of the insulative layer 7 is provided between the protective layer 9b containing Ir and the insulative layer 7. Thus, due to the fact that the exposed region 14 is formed by the protective layers 9a and 9b different in the adhesiveness with the discharge port forming member 120, the layers can play the role of stress reduction while securing the adhesiveness with the discharge port forming member 120, so that a more reliable liquid discharge head can be provided.

The protective layer 9a containing Ta also has a role of an adhesion layer between the protective layer 9b containing Ir and the insulative layer 7.

Fifth Embodiment

Figure 8:
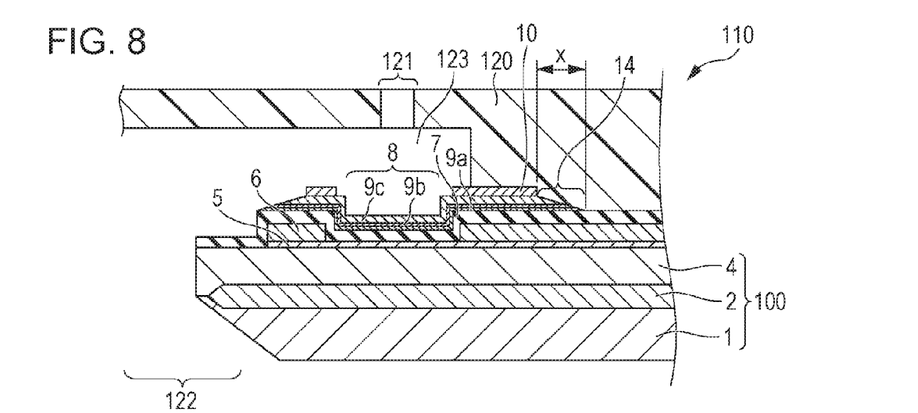
FIG. 8 is a view illustrating a liquid discharge head according to a fifth embodiment.

FIG. 8 illustrates a liquid discharge head 110 according to a fifth embodiment of the present invention, and is a cross-sectional schematic view along the X-X' line of FIG. 1.

In this embodiment, a protective layer 9 is configured to have a three-layer laminated configuration in the second embodiment.

Specifically, a protective layer 9a containing Ta, a protective layer 9b containing Ir, and a protective layer 9c containing Ta are formed on an insulative layer 7. More specifically, the protective layers containing Ta having adhesiveness with the discharge port forming member 120 higher than Ir and lower than that of the insulative layer 7 and the adhesion layer 10 are provided between the protective layer 9b containing Ir and the adhesion layer 10 and between the protective layer 9b and the insulative layer 7. Thus, due to the fact that the exposed region 14 is formed by the protective layers 9a, 9b, and 9c different in the adhesiveness with the discharge port forming member 120, the layers can play the role of stress reduction while securing the adhesiveness with the discharge port forming member 120, so that a more reliable liquid discharge head can be provided. Furthermore, since the protective layer 9a and the protective layer 9c containing Ta are provided on both surfaces of the protective layer 9b containing Ir having low adhesiveness with the discharge port forming member 120 and the insulative layer 7, it becomes possible to further secure the adhesiveness, with the discharge port forming member 120 and the insulative layer 7.

The Ta film also has a role of an adhesion layer between the Ir film and the adhesion layer 10 and between the Ir film and the insulative layer 7.

Example 1

The liquid discharge head 110 according to the fifth embodiment was created as Example 1.

The film thickness of the protective layer 9a containing Ta was set to 0.05 µm. The film thickness of the protective layer 9b containing Ir was set to 0.05 µm. The film thickness of the protective layer 9c containing Ta was set to 0.2 µm. More specifically, the total film thickness of the protective layers was set to 0.3 µm. The width x (FIG. 8) of the exposed region 14 of the protective layer 9, i.e., the total width of the exposed regions 14 of the protective layers 9a to 9c, was set to 0.3 µm.

Example 2

In Example 1, the width of the exposed region 14 of the protective layer 9 was set to 1.0 µm.

Example 3

In Example 1, the width of the exposed region 14 of the protective layer 9 was set to 2.0 µm.

Example 4

In Example 1, the width of the exposed region 14 of the protective layer 9 was set to 3.0 µm.

Comparative Example 1

In Example 1, the width of the exposed region 14 of the protective layer 9 was set to 0.2 µm.

Test Results

In Examples and Comparative Example described above, the adhesiveness between the liquid discharge head substrate 100 and the discharge port forming member 120 was evaluated by a pressure cooker test (PCT) test.

The liquid discharge heads 110 created in Examples and Comparative Example were immersed in ink. (BCI-7eC (manufactured by CANON KA:BUSH KAISHA)). The PCT test was performed under the conditions of 121° C. and 2 atm for 30 hours. After the PCT test, the presence or absence of peeling between the liquid discharge head substrate 100 and the discharge port forming member 120 was confirmed under an optical microscope.

The test results are shown in Table 1. In Table 1, ○ indicates that no peeling occurred, × indicates that the peeling of the discharge port forming member 120 occurred, and Δ indicates that no peeling occurred around the liquid chamber 123 but floating of the discharge port forming member 120 occurred at the pattern end portion of the protective layer 9.

TABLE 1

|  | Total film thickness of protective layer 9 | Width of exposed region 14 | Inclination angle of pattern end portion of protective layer 9 | PCT test results |
| --- | --- | --- | --- | --- |
| Comp. Ex. 1 | 0.3 μm | 0.2 μm | 56° | x |
| Ex. 1 | 0.3 μm | 0.3 μm | 45° | ○ |
| Ex. 2 | 0.3 μm | 1.0 μm | 17° | ○ |
| Ex. 3 | 0.3 μm | 2.0 μm | 9° | ○ |
| Ex. 4 | 0.3 μm | 3.0 μm | 6° | Δ |

In Examples 1 to 4, no peeling was observed between the liquid discharge head substrate 100 and the discharge port forming member 120. In Comparative Example 1, interference fringes were observed in the discharge port forming member 120 around the liquid chamber 123, and it was able to be confirmed that floating occurred between the liquid discharge head substrate 100 and the discharge port forming member 120. Thus, when the width of the exposed region 14 is small, the stress reduction effect was not sufficiently obtained. In Example 4, although no peeling was observed, floating of the discharge port forming member 120 with the exposed region 14 as the starting point was able to be confirmed. This is because the exposed region 14 having low adhesiveness with the discharge port forming member 120 was excessively large.

As described above, it was found that the width of the exposed region 14 of the protective layer 9 is desirably 0.3 μm or more and more desirably 2.0 μm or less in the present invention. Moreover, it was found that, when the inclination angle of the pattern end portion of the protective layer 9 is smaller, the slide in the horizontal direction of the discharge port forming member 120 is likely to occur. It was found from the PCT test results described above that the inclination angle is desirably 45° or less.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-115200, filed Jun. 5, 2015, which is hereby incorporated by reference herein in its entirety.

What is claimed is:

1. A liquid discharge head comprising:
    a liquid chamber wall member having a wall forming a liquid chamber storing liquid; and
    a liquid discharge head substrate containing a laminate of a base substrate having a surface on which an element generating energy for discharging liquid is formed,
    a first layer, and
    a second layer disposed on the first layer, contacting the wall, and having adhesiveness with the liquid chamber wall member higher than the adhesiveness of the first layer, and
    forming the liquid chamber with the liquid chamber wall member, wherein
    the first layer has a portion exposed from the second layer as viewed from a first direction orthogonal to the surface and contacting the liquid chamber wall member at a position distant from the liquid chamber in a second direction orthogonal to an inner surface of the wall relative to a portion where the wall and the second layer contact, and
    a length in the second direction of the portion of the first layer is 0.3 μm or more.

2. The liquid discharge head according to claim 1, wherein the length is 2.0 μm or less.

3. The liquid discharge head according to claim 2, wherein the portion inclines at an angle of 45° or less in a cross section with respect to the first direction.

4. The liquid discharge head according to claim 1, wherein the first layer contains, a plurality of layers and the portion contains the plurality of layers.

5. The liquid discharge head according to claim 4, wherein the plurality of layers are different in the adhesiveness with the liquid chamber wall member.

6. The liquid discharge head according to claim 1, wherein the first layer has a layer containing precious metal elements or alloys of the precious metal elements.

7. The liquid discharge head according to claim 1, wherein the second layer contains silicon.

8. The liquid discharge head according to claim 1, wherein
    the first layer has a third layer and a fourth layer disposed on both surfaces of the third layer and having the adhesiveness with the liquid chamber wall member higher than the adhesiveness of the third layer, and
    the portion contains the third layer and the fourth layers.

9. The liquid discharge head according to claim 1, wherein the first layer is a protective layer covering the element.

10. A method for producing the liquid discharge head according to claim 1, comprising:
    etching the second layer using a mask; and
    etching the first layer using the mask.

* * * * *